United States Patent
Zara et al.

(10) Patent No.: US 11,251,648 B2
(45) Date of Patent: Feb. 15, 2022

(54) BATTERY CHARGE METHOD AND DEVICE

(71) Applicants: Commissariat à l'Energie Atomique et aux Energies Alternatives, Paris (FR); BUBENDORFF SA, Attenschwiller (FR)

(72) Inventors: Henri Zara, Le Bourget du Lac (FR); Thomas Fritsch, Hoenheim (FR); Franck Vial, Paladru (FR); Franck Al Shakarchi, Saint-Sulpice (FR)

(73) Assignees: COMMISSARIAT À L'ENERGIE ATOMIQUE ET AUX ENERGIES ALTERNATIVES, Paris (FR); BUBENDORFF SA, Attenschwiller (FR)

( * ) Notice: Subject to any disclaimer, the term of this patent is extended or adjusted under 35 U.S.C. 154(b) by 612 days.

(21) Appl. No.: 15/848,222

(22) Filed: Dec. 20, 2017

(65) Prior Publication Data
US 2018/0175662 A1 Jun. 21, 2018

(30) Foreign Application Priority Data
Dec. 21, 2016 (FR) ...................................... 1662966

(51) Int. Cl.
H02J 7/35 (2006.01)
H02J 7/00 (2006.01)
(Continued)

(52) U.S. Cl.
CPC .............. H02J 7/35 (2013.01); G01R 31/392 (2019.01); H01M 10/443 (2013.01);
(Continued)

(58) Field of Classification Search
CPC ........................................................ H02J 7/35
(Continued)

(56) References Cited

U.S. PATENT DOCUMENTS 7,598,709 B2 * 10/2009 Guang .................. H02J 7/0077
320/135
2008/0278118 A1 11/2008 Labrunie et al.
(Continued)

FOREIGN PATENT DOCUMENTS

CN 103904379 A 7/2014
EP 1883143 A1 1/2008
(Continued)

OTHER PUBLICATIONS

Partial Preliminary Search Report in French Patent Application No. 1662966 dated Sep. 29, 2017, 2 pages.
(Continued)

*Primary Examiner* — Edward Tso
*Assistant Examiner* — Ahmed H Omar
(74) *Attorney, Agent, or Firm* — Moreno IP Law LLC (57) ABSTRACT

A method of charging a battery of electric accumulators from the electric power supplied by an electric generator, wherein the battery is charged to a first maximum state of charge in a first operating mode and to a second maximum state of charge, lower than the first maximum state of charge, in a second operating mode, the method including switching from the second operating mode to the first operating mode when a criterion using the battery temperature or the ratio of a first quantity representative of the available power which may be supplied by the electric generator to a second quantity representative of the power consumed from the battery is fulfilled.

27 Claims, 5 Drawing Sheets

(51) Int. Cl.
*G01R 31/392* (2019.01)
*H01M 10/44* (2006.01)

(52) U.S. Cl.
CPC ............ *H02J 7/007* (2013.01); *H02J 7/0047* (2013.01); *H02J 7/0091* (2013.01); *H02J 7/007192* (2020.01); *H02J 7/007194* (2020.01); *H02J 7/0069* (2020.01)

(58) Field of Classification Search
USPC ........................................................ 320/101
See application file for complete search history.

(56) References Cited

U.S. PATENT DOCUMENTS

| | | |
|---|---|---|
| 2010/0188053 A1 | 7/2010 | Carkner et al. |
| 2012/0181992 A1 | 7/2012 | Brun-Buisson et al. |
| 2013/0049702 A1 | 2/2013 | Dai et al. |
| 2013/0169211 A1* | 7/2013 | Brun-Buisson ....... H01M 10/44 320/101 |
| 2015/0263564 A1* | 9/2015 | Min ..................... H02J 7/0091 307/24 |
| 2015/0291051 A1* | 10/2015 | Morimoto ............... B60L 50/16 307/10.1 |
| 2016/0013521 A1 | 1/2016 | Matsunaga et al. |
| 2016/0210706 A1* | 7/2016 | Tanaka ............. G06Q 10/06315 |
| 2016/0332531 A1 | 11/2016 | Chazal et al. |
| 2018/0099577 A1* | 4/2018 | Nagata .................. H02J 7/0091 |
| 2018/0210036 A1* | 7/2018 | Yamauchi ........... H01M 10/425 |

FOREIGN PATENT DOCUMENTS

| | | |
|---|---|---|
| EP | 3190681 A1 | 7/2017 |
| FR | 2964265 A1 | 3/2012 |
| FR | 3013151 A1 | 5/2015 |
| FR | 3015124 A1 | 6/2015 |
| JP | 2012075282 A | 4/2012 |

OTHER PUBLICATIONS

European Search Report for European Application No. 17207861 dated Aug. 20, 2018, 14 pages.

* cited by examiner

BATTERY CHARGE METHOD AND DEVICE

This application claims the priority benefit of French patent application number 16/62966, the content of which is hereby incorporated by reference in its entirety to the maximum extent allowable by law.

BACKGROUND

The present disclosure relates to a method of charging a battery of electric accumulators of an autonomous system or of a system connected to the mains.

DISCUSSION OF THE RELATED ART

An autonomous system comprises an electric or electromechanical system, a battery of accumulators for the electric power supply of the electric or electromechanical system, and an electric generator for the battery charge. An example of an autonomous system corresponds to an electric roller shutter powered by a battery charged by photovoltaic cells.

It is generally desirable for the battery life of the autonomous system to be as long as possible. For this purpose, it could be considered advantageous to charge the battery to a maximum as soon as the generator can supply electric power, to provide a maximum battery life in the case where the generator supplies little electric power for a long period. It may however be preferable to limit the maximum state of charge of the battery when the battery temperature is too high. Indeed, the combination of a high state of charge and of a high temperature accelerates the battery aging, be it in the idle state or in operation.

For certain applications, the battery of an autonomous system may be placed in an area which is not air-conditioned. In particular, when the battery is placed outdoors, the battery temperature may strongly vary during a year. As an example, in the summer, the battery temperature may temporarily strongly rise during the day.

It is known to modify the maximum state of charge of the battery according to the ambient temperature, or even to disconnect the battery from the generator. However, this type of regulation is a feedback control and not a feedforward control. It may not prevent, in certain cases, a degradation of the battery. Indeed, when the state of charge of the battery is already high and the ambient temperature increases, a control for decreasing the maximum state of charge of the battery has no effect, so that the battery will operate at a high temperature and with a high state of charge, whereby the battery lifetime may decrease.

SUMMARY

An object of an embodiment is to overcome all or part of the disadvantages of the previously-described autonomous systems or systems connected to the mains.

Another object of an embodiment is to increase the battery lifetime.

Another object of an embodiment is to increase the operational autonomy of the autonomous system.

Another object of an embodiment is for the battery charge to automatically adapt to environmental conditions.

Thus, an embodiment provides a method of charging a battery of electric accumulators from the electric power supplied by an electric generator, wherein the battery is charged to a first maximum state of charge in a first operating mode and to a second maximum state of charge, lower than the first maximum state of charge, in a second operating mode, the method comprising switching from the second operating mode to the first operating mode when a criterion using the temperature of the battery or the ratio of a first quantity representative of the available power capable of being supplied by the electric generator to a second quantity representative of the power consumed from the battery is fulfilled.

According to an embodiment, the method comprises switching from the second operating mode to the first operating mode when the ratio of the first quantity representative of the available power capable of being supplied by the electric generator and the second quantity representative of the power consumed from the battery becomes lower than a first threshold.

According to an embodiment, the method comprises switching from the first operating mode to the second operating mode when the ratio of the first quantity representative of the available power capable of being supplied by the electric generator to the second quantity representative of the power consumed from the battery becomes higher than the first threshold or than a second threshold different from the first threshold.

According to an embodiment, the battery is charged to a third maximum state of charge lower than the second maximum state of charge in a third operating mode, the method comprising switching from the third operating mode to the second operating mode when the ratio of the first quantity to the second quantity becomes lower than a third threshold higher than the first threshold.

According to an embodiment, the method comprises switching from the second operating mode to the third operating mode when the ratio of the first quantity to the second quantity becomes higher than the third threshold, or than a fourth threshold different from the third threshold and higher than the first threshold.

According to an embodiment, the first maximum state of charge varies from 95% to 100%, the second maximum state of charge varies from 50% to 95%, and the third maximum state of charge varies from 20% to 50%.

According to an embodiment, the first threshold varies from 1 to 3 and the third threshold varies from 3 to 15.

According to an embodiment, the electric generator comprises photovoltaic cells.

According to an embodiment, the first quantity is determined based on the measurement of the general irradiance received by the photovoltaic cells.

According to an embodiment, the method comprises determining first values over a time window, the determination of the first quantity comprising determining the average of the first values over the time window, the method further comprising determining second values, the determination of the second quantity comprising determining the average of the second values over the time window.

According to an embodiment, the duration of the time window in the first operating mode is different from the duration of the time window in the second operating mode.

According to an embodiment, the duration of the time window is modified at the end of an operating period of the battery.

According to an embodiment, the method comprises switching from the first operating mode to the second operating mode when the temperature of the battery is higher than a first temperature value for a determined time period.

According to an embodiment, the method comprises switching from the second operating mode to the first operating mode when the temperature of the battery is lower, for a determined time period, than the first temperature value or than a second temperature value, different from the first temperature value.

According to an embodiment, the battery is charged to a third maximum state of charge lower than the second maximum state of charge in a third operating mode, the method comprising switching from the second operating mode to the third operating mode when the temperature of the battery is higher, for a determined time period, than a third temperature value higher than the first temperature value.

According to an embodiment, the method comprises switching from the third operating mode to the second operating mode when the temperature of the battery is lower, for a determined time period, than the third temperature value or than a fourth temperature value different from the third temperature value and higher than the first temperature value.

According to an embodiment, the method further comprises determining the state of health of the battery and holding the state of charge of the battery in the first maximum state of charge when the state of health decreases below a state-of-health value.

According to an embodiment, the battery charge is, further, forbidden as long as the temperature of the battery is higher than a fifth temperature value.

According to an embodiment, the battery charge is further forbidden as long as the temperature of the battery is lower than a sixth temperature value.

An embodiment also provides a system comprising an electric generator, a battery, a circuit for charging the battery from the electric power supplied by the generator, and a charge circuit control unit, the control unit being capable of controlling the charge of the battery to a first maximum state of charge in a first operating mode and to a second maximum state of charge, lower than the first maximum state of charge, in a second operating mode, the control unit being capable of switching from the second operating mode to the first operating mode when a criterion using the temperature of the battery or the ratio of a first quantity representative of the available power capable of being supplied by the electric generator to a second quantity representative of the power consumed from the battery is fulfilled.

According to an embodiment, the control unit is capable of switching from the second operating mode to the first operating mode when the ratio of the first quantity representative of the available power capable of being supplied by the electric generator to the second quantity representative of the power consumed from the battery becomes lower than a first threshold.

According to an embodiment, the control unit is capable of switching from the first operating mode to the second operating mode when the ratio of the first quantity representative of the available power capable of being supplied by the electric generator and the second quantity representative of the power consumed from the battery becomes higher than the first threshold or than a second threshold different from the first threshold.

According to an embodiment, the control unit is capable of controlling the battery charge to a third maximum state of charge lower than the second maximum state of charge in a third operating mode, and the control unit is capable of switching from the third operating mode to the second operating mode when the ratio of the first quantity to the second quantity becomes lower than a second threshold higher than the first threshold.

According to an embodiment, the control unit is capable of switching from the second operating mode to the third operating mode when the ratio of the first quantity to the second quantity becomes higher than the third threshold, or than a fourth threshold different from the third threshold and higher than the first threshold.

According to an embodiment, the control unit is capable of switching from the first operating mode to the second operating mode when the temperature of the battery is higher than the first temperature value for a determined time period.

According to an embodiment, the control unit is capable of switching from the second operating mode to the first operating mode when the temperature of the battery is lower, for a determined time period, than the first temperature value or than a second temperature value, different from the first temperature value.

According to an embodiment, the control unit is capable of controlling the charge of the battery to a third maximum state of charge lower than the second maximum state of charge in a third operating mode, and the control unit is capable of switching from the second operating mode to the third operating mode when the temperature of the battery is higher, for a determined time period, than a third temperature value higher than the first temperature value.

According to an embodiment, the control unit is capable of switching from the third operating mode to the second operating mode when the temperature of the battery is lower, for a determined time period, than the third temperature value or than a fourth temperature value, different from the third temperature value and higher than the first temperature value.

According to an embodiment, the electric generator comprises photovoltaic cells.

The foregoing and other features and advantages will be discussed in detail in the following non-limiting description of specific embodiments in connection with the accompanying drawings.

DETAILED DESCRIPTION OF THE PRESENT EMBODIMENTS

The same elements have been designated with the same reference numerals in the different drawings. For clarity, only those elements which are useful to the understanding of the described embodiments have been shown and are detailed. In particular, the structure of an electric accumulator of a battery of accumulators is well known and is not described in detail. In the following description, when reference is made to terms qualifying absolute positions, such as terms "front", "back", "top", "bottom", "left", "right", etc., or relative positions, such as terms "above", "under". "upper", "lower", etc., or to terms qualifying directions, such as terms "horizontal", "vertical", etc., it is referred to the orientation of the drawings. Unless otherwise specified, expressions "approximately", "substantially", and "in the order of" mean to within 10%, preferably to within 5%.

Figure 1:
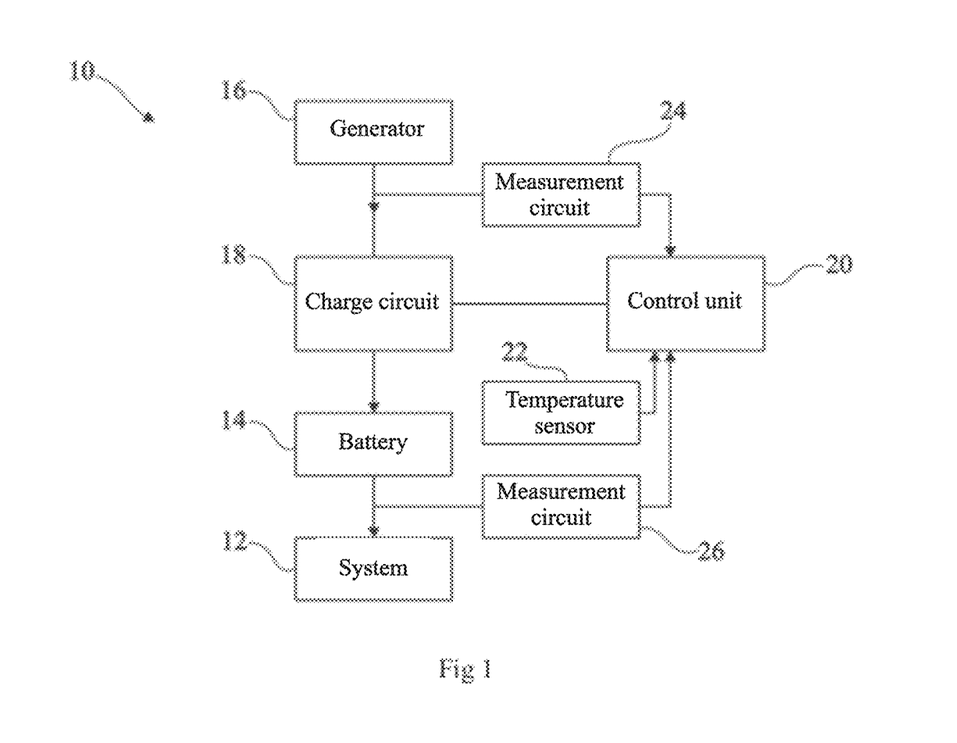
FIG. 1 partially and schematically shows an embodiment of an autonomous system.

FIG. 1 shows an embodiment of an autonomous system 10 comprising:

an electric or electromechanical system 12;

at least one battery 14 of electric accumulators allowing the electric power supply of electric or electromechanical system 12;

an electric generator 16 for the charge of battery 14;

a charge circuit 18 connected between electric generator 16 and battery 14;

a unit 20 for controlling charge circuit 18;

a sensor 22 of the temperature of battery 14 connected to control unit 20;

a circuit 24 for measuring the voltage across generator 16 and the current supplied by generator 16, connected to control unit 20; and a circuit 26 for measuring the voltage across battery 14 and the current supplied by battery 14, connected to control unit 20.

Electric or electromechanical system 12 may correspond to any type of system requiring an electric power supply. As an example, electric or electromechanical system 12 corresponds to an electric roller shutter, an electric gate, a motor-driven window, or a piece of street furniture requiring an electric power supply, for example, a pay-and-display machine or street lighting equipment.

Electric generator 16 may correspond to any type of electric power source. Electric generator 16 may correspond to a generating unit or to an electric power generation facility connected to battery 14 by the electric distribution system. Preferably, electric generator 16 is capable of supplying electric energy from renewable energy, for example, solar energy, wind energy, hydraulic energy, or geothermal energy. As an example, electric generator 16 comprises photovoltaic cells capable of outputting a DC electric current and/or a DC electric voltage when they receive an incident solar radiation, the photovoltaic cells being interconnected, in series or in parallel, via an electric circuit and/or capable of being arranged on one or a plurality of photovoltaic panels, the assembly of the interconnected photovoltaic cells being called photovoltaic power plant 16 in the following description. According to another example, electric generator 16 comprises at least one wind turbine or one hydraulic device.

Battery 14 may correspond to a battery of electric accumulators of any type, particularly a lithium battery, a metal nickel-hydride battery, or a lead-acid battery. The electric accumulators of battery 14 may be assembled in series and/or in parallel.

Control unit 20 may correspond to a dedicated circuit and/or may comprise a processor, for example, a microprocessor or a microcontroller, capable of executing instructions of a computer program stored in the memory.

Charge circuit 18 is a circuit interposed between electric generator 16 and battery 14. In the case where electric generator 16 comprises photovoltaic cells, charge circuit 18 may only correspond to a circuit preventing the discharge of battery 14 into the photovoltaic cells when the latter generate no electric energy. More generally, charge circuit 18 may be capable of converting the electric power supplied by generator 16 into electric energy capable of charging battery 14. Charge circuit 18 for example comprises a voltage converter, for example, a series chopper converter (Buck converter).

Control unit 20 is capable of controlling charge circuit 18 to implement a charge method adapted to the specificities of battery 14. Control unit 20 is for example capable of implementing a maximum power point tracking method (MPPT). Control unit 20 is further capable of controlling charge circuit 18 to prevent the charge of battery 14 by electric generator 16.

According to an embodiment, temperature sensor 22 is arranged in contact with the accumulators of battery 14. According to an embodiment, a plurality of temperature sensors 22 are present and arranged in contact with the accumulators of battery 14 at different locations. The temperature of battery 14 may then correspond to the highest temperature from among the temperatures measured by the temperature sensors or to an average of the temperatures measured by the temperature sensors. According to another embodiment, temperature sensor 22 is capable of measuring the ambient temperature, that is, the temperature in the vicinity of battery 14, for example, more than 10 cm away from battery 14. Control unit 18 is then capable of estimating the temperature of battery 14 based on the measured ambient temperature by using charts stored in the memory.

Control unit 20 may be capable of determining the electric power supplied by generator 16 based on the measurements of the voltage and of the current supplied by measurement circuit 24. Control unit 20 is further capable of estimating the state of charge of battery 14, called SoC, for example, by means of charts stored in the memory, based on measurements of the temperature of battery 14 supplied by temperature sensor 22 and on measurements of the voltage across battery 14 and of the current supplied by battery 14, supplied by measurement circuit 26.

According to an embodiment, control unit 20 simultaneously implements two methods of controlling charge circuit 18.

According to an embodiment, the first control method aims at preventing any operation of charge of battery 14 only if the temperature of battery 14 is too high or too low, to avoid a degradation of battery 14.

Figure 2:
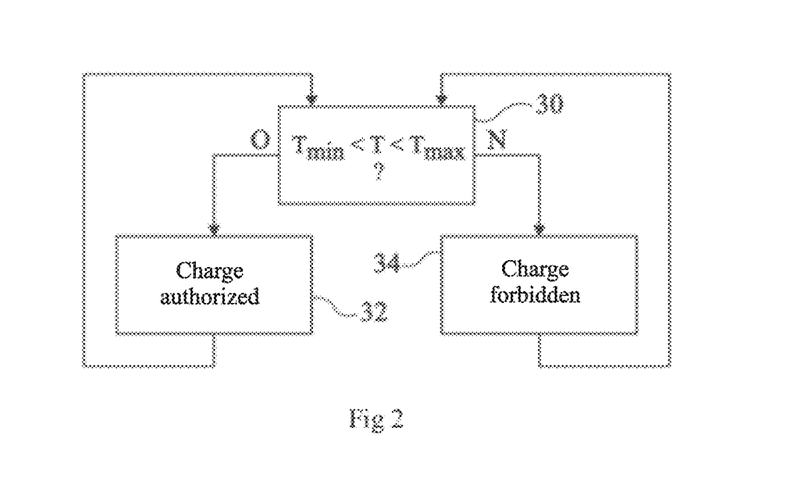
FIG. 2 is an operation chart of an embodiment of a first battery charge method implemented by the autonomous system shown in FIG. 1.

FIG. 2 shows a more detailed operation chart of an embodiment of the first control method.

At step 30, control unit 20 verifies whether the temperature of battery 14 is between a minimum temperature $T_{min}$ and a maximum temperature $T_{max}$. As an example, minimum temperature $T_{min}$ is equal to 0° C. As an example, maximum temperature $T_{max}$ is in the range from 40° C. to 60° C., preferably from 45° C. to 50° C. If the temperature of battery 14 is between temperatures $T_{min}$ and $T_{max}$, the method carries on at step 32. If not, the method carries on at step 34.

At step 32, control unit 20 allows an operation of charge of battery 14. The method carries on at step 30.

At step 34, control unit 20 prevents any operation of charge of battery 14. The method carries on at step 30.

According to an embodiment, the second method of controlling charge circuit 18 aims, for a battery charge operation, at selecting a set point for the maximum state of charge that battery 14 can reach, among a first value called low set point, a second value called intermediate set point higher than the low set point, and a third value called high set point higher than the intermediate set point. The low set point, preferably varying from 20% to 50%, for example, equal to 30%, is selected when there is a light risk that the power supplied by generator 16 of autonomous system 10 and capable of being used for the charge of battery 14 will not be able to compensate for the power supplied by battery 14 to power electric or electromechanical system 12. The intermediate set point, preferably varying from 50% to 95%, for example, equal to 90%, is selected when there is a risk, still light, but a little higher than in the previous case, that the power supplied by generator 16 of autonomous system 10 and capable of being used to charge battery 14 will not be able to compensate for the power supplied by battery 14 for the power supply of electric or electromechanical system 12. The high set point, preferably varying from 95% to 100%, for example, equal to 100%, is selected in the other cases.

According to an embodiment, the modification of the maximum state of charge set point is performed by comparing with thresholds ratio Esol/Eutil of first data Esol, called available power, representative of the power capable of being supplied by generator 16 over a first analysis time window, to second data Eutil, called consumed power, representative of the power consumed by electric or electromechanical system 12 over a second analysis window, which may be identical to the first analysis window or different from the first analysis window.

Table 1 hereafter indicates the value of the set point for the maximum state of charge of battery 14 according to the comparison of ratio Esol/Eutil with thresholds according to an embodiment:

TABLE I

|  | Esol/Eutil < low threshold | Low threshold < Esol/Eutil < high threshold | Esol/Eutil > high threshold |
|---|---|---|---|
| Low set point |  |  | X |
| Intermediate set point |  | X |  |
| High set point | X |  |  |

In the case where electric generator 16 comprises photovoltaic cells, the determination of available power Esol may comprise determining, for several consecutive days, for example, 10 days, the general irradiance received by the photovoltaic cells.

The general irradiance corresponds to the power of an electromagnetic radiation received by an object per surface area unit. According to an embodiment, the measured general irradiance is that of the useful spectrum of the sunlight received by the photovoltaic cells. In a given plane, for example, that of the photovoltaic panels comprising the photovoltaic cells, the general irradiance is the sum of three components:

the direct irradiance, which directly originates from the sun, this component being zero when the sun is hidden by clouds or by an obstacle;

the diffuse irradiance, which corresponds to the radiation received from the vault of heaven, except for direct radiation; and the reflected irradiance, which corresponds to the radiation reflected by the ground and the environment.

The general irradiance may be determined from the measurement of the short-circuit current of photovoltaic plant 16.

According to another embodiment, particularly in the case where electric generator 16 comprises no photovoltaic cells, control unit 20 may determine available power Esol over an analysis window based on the voltage and current measurements supplied by measurement circuit 24.

According to an embodiment, in the case where the power supply voltage of electric or electromechanical system 12 is constant, consumed power Eutil may be determined by the measurement of the current consumed by electric or electromechanical system 12. According to an embodiment, in the case where the power supply voltage of electric or electromechanical system 12 is not constant, consumed power Eutil may be determined by the measurement of the current consumed by electric or electromechanical system 12 and the measurement of the power supply voltage of electric or electromechanical system 12. When electric or electromechanical system 12 comprises a roller shutter, consumed power Eutil may be determined by the measurement of the current consumed by the electric motor driving the roller shutter each time the roller shutter is being used during the analysis window.

According to another embodiment, control unit 20 is capable of determining consumed power Eutil by counting the number of activations of electric or electromechanical system 12 over the analysis window and by determining the product of this number of activations and of an estimate of the power consumed for each activation, or activation power, stored in a memory. This advantageously enables not to have to directly measure the power consumed by electric or electromechanical system 12.

When electric or electromechanical system 12 comprises a roller shutter, the activation power particularly depends on the size of the shutter, which is not known offhand by control unit 20. The activation power may be estimated by control unit 20 by the duration of the travel from the opening to the closing of the roller shutter or from the closing to the opening of the roller shutter. According to an embodiment, a look-up table providing a correspondence between the shutter opening and closing duration and the activation power for all possible sizes of roller shutter is stored in a memory of control unit 20. At the first use of the roller shutter, control unit 20 is capable of measuring the shutter opening or closing duration and of selecting from the table the adapted value of the activation power. According to another example, the activation power may be measured once, for example, on installation of the roller shutter, for example by measurement of the current consumed by the roller shutter and measurement of the roller shutter power supply voltage during an activation of the roller shutter.

The thresholds with which ratio Esol/Eutil is compared may be previously determined and stored in a memory of control unit 20. The thresholds depend on the targeted application and particularly on the importance granted to the constraint of operational autonomy of the autonomous system, also called continuity of service, and to the constraint of maximizing the lifetime of battery 14.

Figure 3:
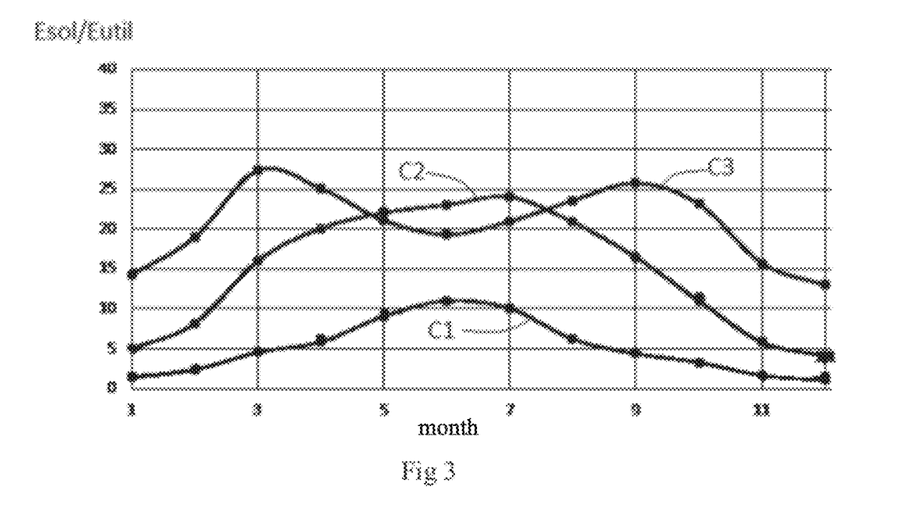
FIG. 3 shows curves of the time variation of the ratio of the available power capable of being supplied by the electric generator of the autonomous system to the power consumed by the autonomous system of FIG. 1, according to different operating conditions.

FIG. 3 shows curves C1, C2, and C3, obtained by simulation, of ratio Esol/Eutil in an embodiment where electric generator 16 comprises photovoltaic cells respectively facing north, east, and south, and where electric or electromechanical system 12 comprises a roller shutter. In this example, ratio Esol/Eutil varies from 1 to 27.

Based on many simulations similar to that of FIG. 3, the inventors have defined thresholds in an embodiment where electric generator 16 comprises photovoltaic cells and where electric or electromechanical system 12 comprises a roller shutter.

According to an embodiment of a method of controlling the value of the set point of the maximum state of charge of battery 14 according to the previous table I, the maximum state of charge that battery 14 can reach is the high set point when ratio Esol/Eutil is lower than the low threshold, in the range from 1 to 3. The low threshold enables to keep a power resource margin to ensure the continuity of service. The maximum state of charge that battery 14 can reach is the intermediate set point when ratio Esol/Eutil is higher than the low threshold and lower than or equal to the high threshold in the range from 3 to 15. The high threshold enables to keep a power resource margin so that the state of charge can easily rise up to 100% in the case of irradiance conditions becoming less favorable. The maximum state of charge that battery 14 can reach is the low set point when ratio Esol/Eutil is higher than the high threshold. This threshold enables to keep a high power resource margin. This enables both too guarantee the possibility to easily raise the state of charge to the intermediate set point in the case of irradiance conditions becoming less favorable and at the same time of preventing overheating conditions. This threshold is preferably defined for the most penalizing environmental conditions regarding high temperatures of battery 14.

Figure 4:
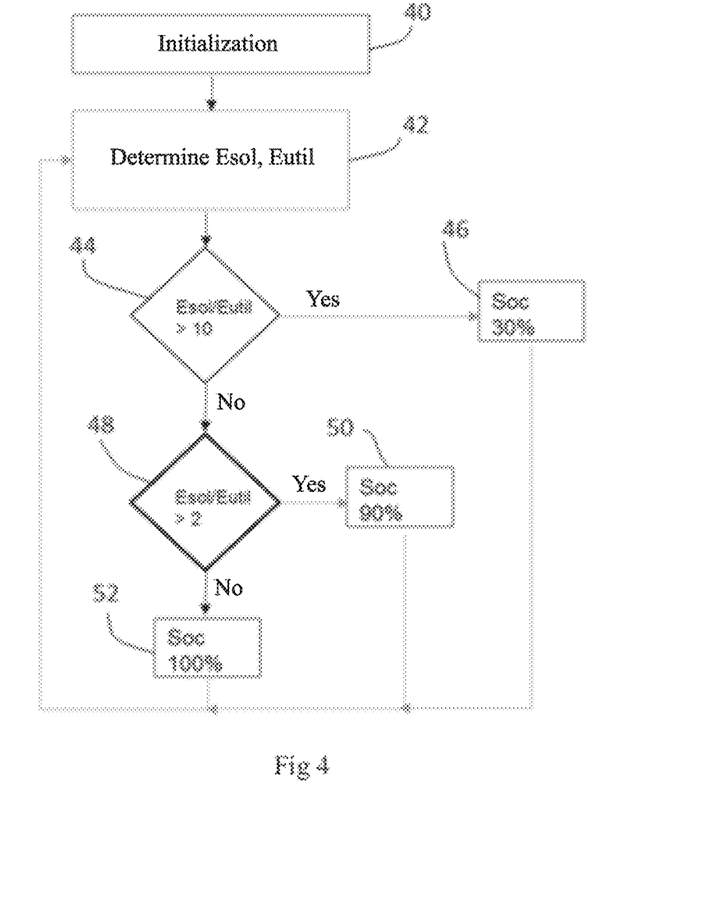
FIG. 4 is an operation chart of another embodiment of a second battery charge method implemented by the autonomous system shown in FIG. 1.

FIG. 4 shows an operation chart of an embodiment of the second method of controlling charge circuit 18.

Step 40 corresponds to an initialization step where control unit 20 is automatically placed at the first starting of autonomous system 10, for example, on powering-on of autonomous system 10. According to an embodiment, at step 40, an operation of charge of battery 14 is authorized according to an operating mode defined by default, for example, at the intermediate set point. This advantageously enables, if battery 14 is partially discharged on powering-on of autonomous system 10, to immediately start completing its charge. The method carries on at step 42.

At step 42, control unit 20 determines new values of available power Esol and of consumed power Eutil. Control unit 20 then determines a new value of ratio Esol/Eutil.

According to an embodiment, to determine ratio Esol/Eutil, control unit 20 determines the average of the values of available power Esol determined over an analysis window of several consecutive days, preferably 10 days, to be representative of a general tendency of the evolution of weather conditions. To determine ratio Esol/Eutil, control unit 20 determines the average of the values of the consumed power Eutil determined over the analysis window of several consecutive days, preferably 10 days, to be representative of a general tendency of the power consumption of electric or electromechanical system 12.

The values of available power Esol are for example determined at regular intervals, preferably every 5 minutes. It is advantageous for the measurement step to be shorter than 60 minutes so that the determination of available power Esol is little modified by strong variations over short periods of the irradiance, for example, when the sun is briefly hidden by clouds. The values of consumed power Eutil may be determined on each use of electric or electromechanical system 12.

As an example, the determination of a new value of ratio Esol/Eutil is carried out for each new value of available power Esol or of consumed power Eutil with the previous measurements of available power Esol or of consumed power Eutil made during the analysis window which ends with the last measurement performed. According to another example, the determination of a new value of ratio Esol/Eutil is carried out at regular intervals, preferably once a day with the measurements of available power Esol and of consumed power Eutil performed during the analysis window.

According to an embodiment, at the beginning of the operation of autonomous system 10, ratio Esol/Eutil is determined with the values measured over the number of operating days of autonomous system 10 until the duration of the analysis window is reached. The method carries on at step 44.

At step 44, control unit 20 compares the new value of ratio Esol/Eutil with the high threshold. If ratio Esol/Eutil is higher than the high threshold, the method carries on at step 46. If ratio Esol/Eutil is lower than or equal to the high threshold, the method carries on at step 48.

At step 46 control unit 20 switches to an operating mode, called low mode, where the set point for the maximum state of charge of battery 14 is the low set point. The method of charging battery 14, that is, the control of charge circuit 18 by control unit 20, may be specific in the low mode. As an example, the maximum state of charge of battery 14 may be maximum. As a variation, the method of charging battery 14 in the low mode may be identical to the battery charge method in the intermediate mode and/or the high mode, only the set point for the maximum state of charge of the battery being different. The low operating mode carries on as long as there is no switching to another operating mode and as long as there is no charge interruption requested by the first previously-described operating mode. The method carries on at step 42.

At step 48, control unit 20 compares the new value of ratio Esol/Eutil with the low threshold. If ratio Esol/Eutil is higher than the low threshold, the method carries on at step 50. If ratio Esol/Eutil is smaller than or equal to the low threshold, the method carries on at step 52.

At step 50 control unit 20 switches to an operating mode, called intermediate mode, where the set point for the maximum state of charge of battery 14 is the intermediate set point. The method of charging battery 14, that is, the control of charge circuit 18 by control unit 20, may be specific in the intermediate operating mode. As a variation, the method of charging battery 14 in the intermediate mode may be identical to the battery charge method in the low mode and/or the high mode, only the set point for the maximum state of charge of the battery being different. The intermediate operating mode carries on as long as there is no switching to another operating mode and as long as no charge interruption has been requested by the first previously-described operating method. The method carries on at step 42.

At step 52 control unit 20 switches to an operating mode, called high mode, where the set point for the maximum state of charge of battery 14 is the high set point. The method of charging battery 14, that is, the control of charge circuit 18 by control unit 20, may be specific in the high mode. As an example, the maximum charge current of battery 14 may be limited. As a variation, the method of charging battery 14 in the high mode may be identical to the battery charge method in the low mode and/or the intermediate mode, only the set point for the maximum state of charge of the battery being different. The high operating mode carries on as long as there is no switching to another operating mode and as long as no charge interruption has been requested by the first previously-described operating method. The method carries on at step 42.

Comparison steps 44 and 48 may be carried out each time a new value of ratio Esol/Eutil is determined or at regular intervals, preferably once a day.

To assess an improvement of the lifetime of battery 14, the state of health or SOH of battery 14 may be determined. The determination of the state of health of the battery may be performed based on models of aging of battery 14, which particularly take into account:
the quantity of power delivered by battery 14 during its lifetime;
the time spent by battery 14 at different temperature levels;
the operating duration of autonomous system 10.

An example of a method of determining the state of health of a battery is described in "Electrochemical Energy Storage for Renewable Sources and Grid Balancing" at chapter 20 entitled "Battery management and battery diagnostics" written by Angel Kirchev (2015 Elsevier B. V, pages 411-435).

Figure 5:
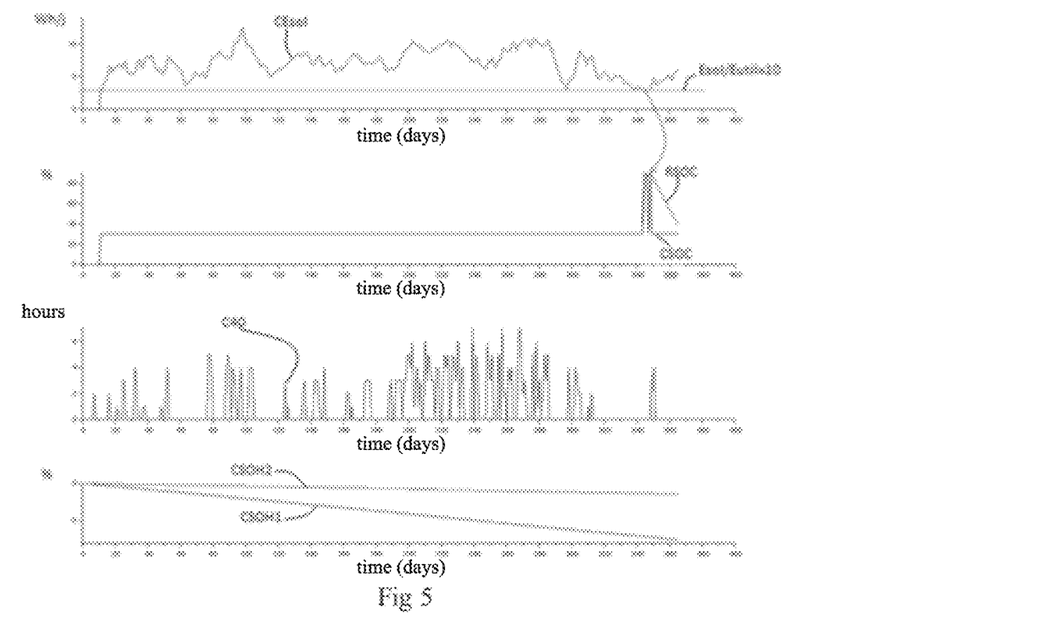
FIG. 5 shows curves of the time variation, obtained by simulation for the autonomous system of FIG. 1 in specific weather conditions, of the available power capable of being supplied by the electric generator of the autonomous system, of the set point for the state of charge (SoC) of the battery of the autonomous system, of the state of charge of the battery of the autonomous system, of the number of hours for which the battery temperature of the autonomous system is higher than 40° C., of the state of health of the battery of the autonomous system when the charge method illustrated in FIG. 4 is not implemented, and of the state of health of the battery of the autonomous system when the charge method illustrated in FIG. 4 is implemented.

FIG. 5 shows variation curves CEsol, CSOC, RSOC, C40, CSOH1, and CSOH2 over one year obtained by simulations for an autonomous system 10 comprising photovoltaic cells facing south. The simulations are disclosed based on meteorological irradiance data on a specific site.

Curve CEsol is the curve of the time variation of available power Esol capable of being supplied by generator 16 of autonomous system 10. Curve CSOC is the curve of the time variation of the set point for the state of charge of battery 14. Curve RSOC is the curve of the time variation of the state of charge of battery 14. Curve C40 is the curve of the time variation of the number of hours for which the temperature of battery 14 is higher than 40° C. Cure CSOH1 is the curve of the time variation of the state of health of battery 14 when the charge method illustrated in FIG. 4 is not implemented and curve CSOH2 is the curve of the time variation of the state of health of battery 14 when the charge method illustrated in FIG. 4 is implemented.

As shown in curve RSOC, the state of charge of battery 14 is 30% most of the time, except for a short shoulder season period when irradiance conditions become less favorable (that is, ratio Esol/Eutil is smaller than 10). This results in a fast rise of the battery state of charge to 90%. It can be verified that this period corresponds to moderate battery temperatures (lower than 40° C.). The gain in terms of battery aging is shown by considering the time spent at high temperature, that is a 1% decrease of the state of health of battery 14 when the charge method illustrated in FIG. 4 is implemented and a 7% decrease of the state of health of battery 14 when the charge method illustrated in FIG. 4 is not implemented.

Figure 6:
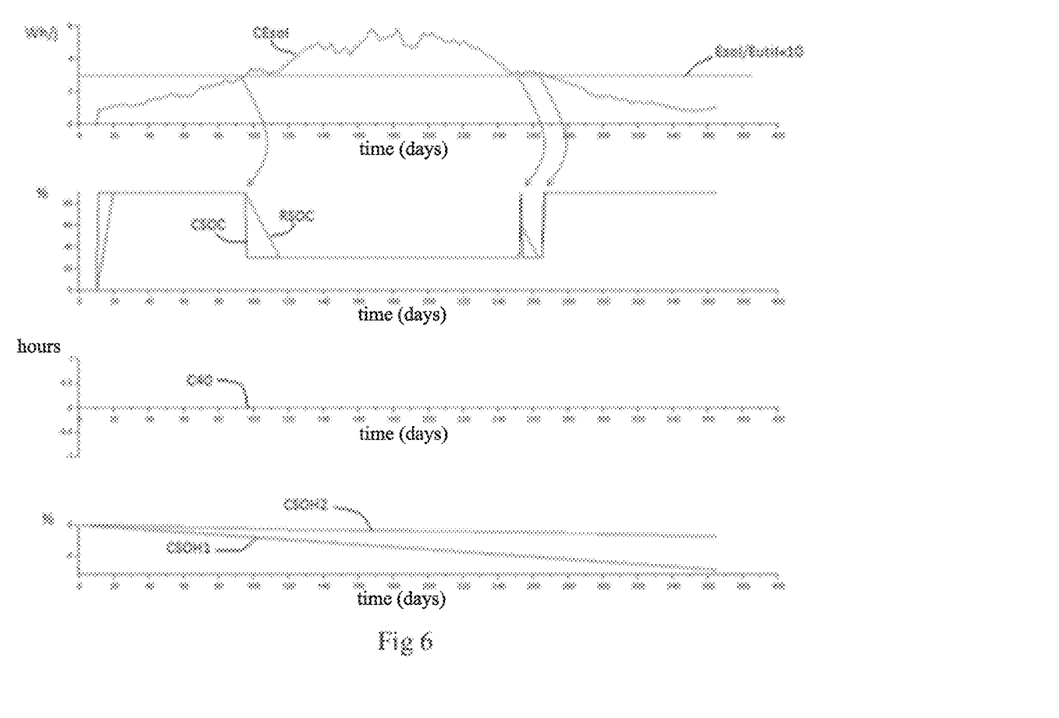
FIG. 6 shows variation curves similar to the curves shown in FIG. 5 for different weather conditions.

FIG. 6 shows variation curves similar to the curves shown in FIG. 5, obtained by simulations over one year for an autonomous system 10 comprising photovoltaic cells facing north, that is, in more unfavorable exposure situation. As shown by curve RSOC, the state of charge is 90% in shoulder seasons and 30% in the summer for a criterion of passing to Esol/Eutil equal to 10. In this case, the temperature of battery 14 is still moderate (that is, smaller than 40° C.). However, the implementation of the charge method illustrated in FIG. 4 enables to decrease the battery aging since a 2% decrease in the state of health of battery 14 can be observed when the charge method illustrated in FIG. 4 is implemented and a 7% decrease in the state of health of battery 14 when the charge method illustrated in FIG. 4 is not implemented.

As appears in the simulations, in a strong sunlighting situation where the battery temperature reaches values favoring the aging (that is, higher than 40° C.), the state of charge is limited to 30%, and in low illumination situation where the battery temperatures remain limited, the state of charge is 90%.

An explanation of the gain in terms of battery aging is that the charge method tends to command the lowest possible charge rate while fulfilling the criterion of continuity of service. The aging of battery 14 is then decreased and this, all the more as the temperature is high.

It can be observed that the aging with the implementation of the charge method illustrated in FIG. 4 is stronger for the simulations illustrated in FIG. 6 concerning a northern exposure of the photovoltaic cells of autonomous system 10 than for the simulations illustrated in FIG. 5 which concern a southern exposure of the photovoltaic cells of autonomous system 10. An explanation is that the state of charge of battery 14 is higher in the case of the northern exposure than of the southern exposure. The more favorable temperature conditions in the case of the northern exposure thus do not improve the battery lifetime since the state of charge remains high for a longer period. The charge method illustrated in FIG. 4 advantageously enables to increase the battery lifetime even in this case.

Generally, at the end of their lifetime, the maximum storage capacity of batteries progressively degrades. It may then no longer be possible to ensure to the continuity of service of the autonomous system. It may then no longer be judicious to keep a state of partial charge of battery 14, at risk of not fully taking advantage of the battery capacities. According to an embodiment, from a certain state of health level, the 100% battery charge is permanently authorized to ensure the continuity of service until the ultimate aging of the battery.

Figure 7:
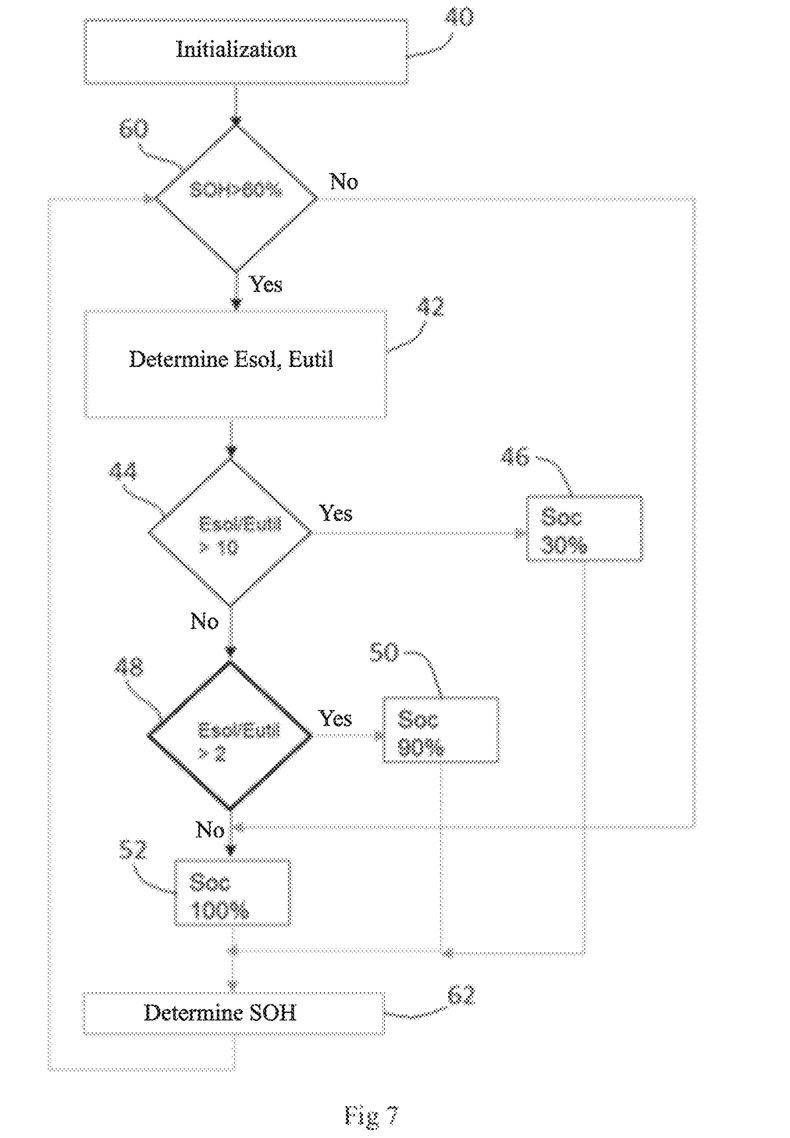
FIG. 7 is an operation chart of another embodiment of the second battery charge method implemented by the autonomous system shown in FIG. 1.

FIG. 7 is an operation chart of another embodiment of the second battery charge method implemented by autonomous system 10 shown in FIG. 1. The steps common with the embodiment of the second charge method previously described in relation with FIG. 4 are indicated with the same reference numerals.

The method starts at previously-described initialization step 40. At this step, control unit 20 further initializes the battery state of health at 100%. The method carries on at step 60.

At step 60, control unit 20 compares the state of health of battery 14 with a threshold in the range from 50% to 70%, for example, equal to 60%. If the state of health is higher than the threshold, the method carries on at previously-described step 42. If the state of health is lower than or equal to the threshold, the method carries on at previously-described step 52.

After the execution of previously-described steps 46, 50, 52, the method does not carry on at step 42 as for the embodiment of the control method previously described in relation with FIG. 4 but, in the present embodiment, the method carries on at step 62.

At step 62, control unit 20 determines the state of health of battery 14. According to an embodiment, to determine the state of health, control unit 20 may determine the number of hours spent by battery 14 between 30° C. and 40° C., the number of hours spent by battery 14 between 40° C. and 50° C., and the number of hours spent by battery 14 between 50° C. and 60° C. Control unit 20 may further determine the quantity of power supplied by battery 14 since its putting into service. Control unit 20 may further determine the total operating time of battery 14. The method carries on at step 60.

According to another embodiment, the determination of the state of health of battery 14 may be obtained by determining the power consumed by electric or electromechanical system 12 between two identifiable levels of the state of charge of battery 14, for example, 90% and 30%, and by then comparing this power with the initial performance of battery 14. According to another embodiment, the determination of the state of health may comprise counting the number of activations of electric or electromechanical system 12 between two identifiable levels of the state of charge of battery 14, for example, 90% and 30%, and then comparing this power with the initial performance of battery 14. The determination of a new value of the state of health may be periodically implemented (for example, every 500 activations of electric or electromechanical system 12) for a period when the irradiance is high so that the state of charge of battery 14 can decrease to the low set point, for example, 30%. In the case where the state of charge of battery 14 never decreases to the low set point, for example, in the case of an unfavorable exposure, rather than being calculated by the method comprising counting the number of activations of electric or electromechanical system 12 between two identifiable levels of the state of charge of battery 14, for example, 90% and 30%, since the state of charge of battery 14 is permanently high (at the intermediate set point, for example, 90%, or at the high set point, for example, 100%), the state of health may be calculated by other methods.

Advantageously, the implementation of the previously-described charge methods does not require a determination of the date of the day by control unit 20. The determination of the operating mode of autonomous system 10 is automatically performed on starting thereof.

Specific embodiments have been described. Various alterations, modifications, and improvements will readily occur to those skilled in the art.

In particular, in previously-described embodiments the time of calculation of the average of available power Esol and of consumed power Eutil is 10 days, whatever the operating mode of autonomous system 10. However, this time may be different according to the operating mode of control unit 20.

When the continuity of service is desired to be privileged, it may be desirable to increase the reactivity of control unit 20 when going towards high states of charge of battery 14. In this case, the time of calculation at step 42 of the average of available power Esol and of consumed power Eutil may be shorter in the high mode than in the intermediate mode and may be shorter in the intermediate mode than in the low mode. As an example, in the high mode, where the set point for the maximum state of charge of battery 14 is for example 100%, the duration of calculation of the average of available power Esol and of consumed power Eutil may be shorter than 10 days, for example, equal to 6 days. In the intermediate operating mode, where the set point for the maximum state of charge is for example 90%, the duration of calculation of the average of available power Esol and of consumed power Eutil may be shorter than 10 days, for example, equal to 8 days and in the low operating mode, where the set point for the maximum state of charge is for example 30%, the duration of calculation of the average of available power Esol and of consumed power Eutil may be left at 10 days.

When the battery lifetime is desired to be privileged over the continuity of service, it may be desirable to decrease the reactivity of control unit 20 when it going towards high states of charge. In this case, the time of calculation at step 42 of the average of available power Esol and of consumed power Eutil may be longer in the high mode than in the intermediate mode and may be longer in the intermediate mode than in the low mode. As an example, in a high operating mode, the duration of calculation of the average of available power Esol and of consumed power Eutil may be left at 10 days. In the intermediate operating mode, the duration of calculation of the average of available power Esol and of consumed power Eutil may be shorter than 10 days, for example, equal to 8 days, and in the low operating mode, the duration of calculation of the average of available power Esol and of consumed power Eutil may be shorter than 10 days, for example, equal to 6 days.

In particular, in the previously-described embodiments, the duration of the analysis window for the calculation of the average of available power Esol and of consumed power Eutil is constant during the operation of autonomous system 10. However, such a duration of the analysis window may not be optimal, particularly according to the geographic location of autonomous system 10 and to the exposure of autonomous system 10. Indeed, it has generally been obtained after many trials to take into account the most unfavorable cases.

Figure 8:
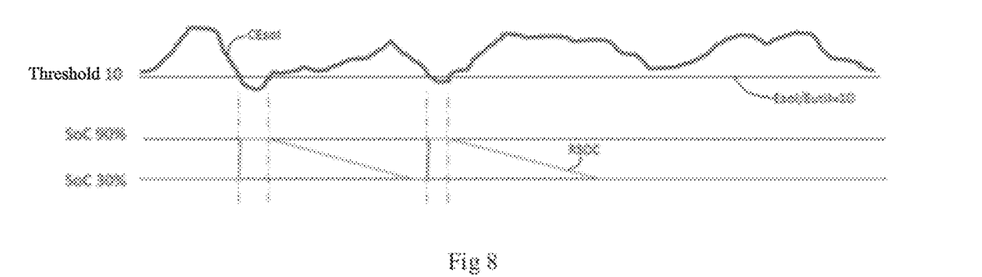
FIG. 8 shows curves of the time variation, obtained by simulation for the autonomous system of FIG. 1 in specific weather conditions, of the available power capable of being supplied by the electric generator of the autonomous system and of the state of charge of the battery of the autonomous system when the charge method illustrated in FIG. 4 is implemented.

FIG. 8 shows curves CEsol and RSOC of the time variation, obtained by simulation in specific weather conditions, respectively of the available power capable of being supplied by generator 16 of autonomous system 10 and of the state of charge of battery 14 of the autonomous system when the charge method illustrated in FIG. 4 is implemented. As appears in the drawing, the state of charge switches twice to 90% while ratio Esol/Eutil is practically all the time greater than 10. This means that the duration of the analysis window is not optimal and that it should be increased. Indeed, increasing the duration of the analysis window increases the smoothing effect, which enables to suppress short periods where unit 20 makes the state of charge of battery 14 rise to 90% without this being really necessary.

According to an embodiment, the duration of the analysis window used to calculate the average of available power Esol and of consumed power Eutil may be modified during the operation of autonomous system 10. According to an embodiment, at the first putting into service of autonomous system 10, the value of the duration of the analysis window used is a value stored in a memory of control unit 20. Control unit 20 determines a new value of the duration of the analysis window according to the behavior of autonomous system 10 for a certain period, for example, one year, so that autonomous system 10 has operated in all seasons.

Control unit 20 may determine at the end of the period the states of charge which have really been reached and the values of ratios Esol/Eutil for each state of charge level. Control unit 20 can then update the durations of the analysis windows for each high, intermediate, and low mode when these durations are different according to the operating mode of the autonomous system, or update the duration of the analysis window when the latter is common to the high, intermediate, and low modes. The present embodiment enables to improve the battery aging decrease.

According to another embodiment, low states of charge may be more or less favored. When the continuity of service is desired to be privileged, it is possible to select rather high values for the low and high thresholds. For example, the low threshold may be equal to 2 and the high threshold may be equal to 10. When the lifetime of battery 14 is desired to be favored, it is possible to select rather low values for the low and high thresholds. For example, the low threshold may be equal to 1.5 and the high threshold may be equal to 5.

Figure 9:
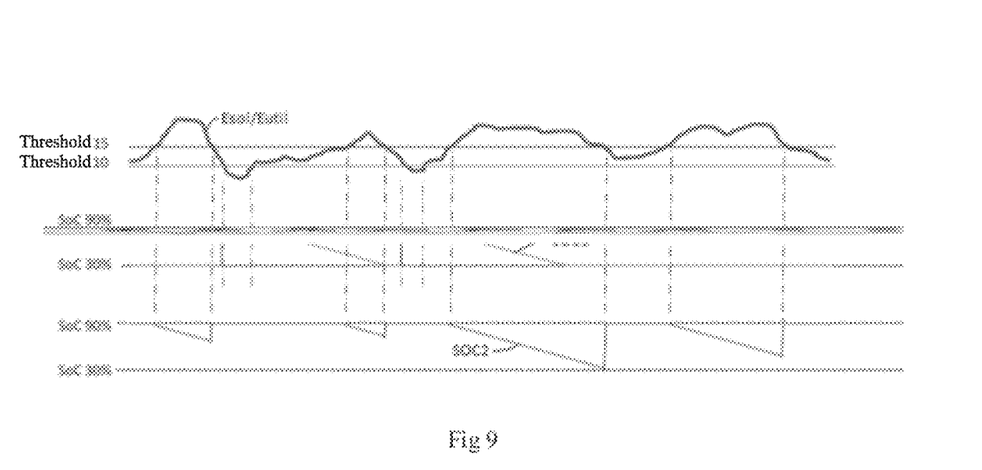
FIG. 9 shows curves of the time variation, obtained by simulation for the autonomous system of FIG. 1 in specific weather conditions, of the ratio of the available power capable of being supplied by the electric generator of the autonomous system to the power consumed by the autonomous system of FIG. 1, and of the state of charge of the battery for two threshold values implemented by the charge method illustrated in FIG. 4.

FIG. 9 shows a curve of the variation of ratio Esol/Eutil, a curve SOC1 of the variation of the battery state of charge when the high threshold is equal to 10, and a curve SOC2 of the variation of the battery state of charge when the high threshold is equal to 15. It should be noted that for curve SOC2, the battery state of charge is kept more frequently at 90% than for curve SOC1.

According to another embodiment, in the case where electric generator 16 is capable of supplying an electric power which is substantially constant over time, for example, when electric generator 16 corresponds to a generating unit or to an electric power generation facility connected to battery 14 by the electric distribution system, the management of the battery state of charge can be deduced from the battery temperature by measuring the daily number of hours spent above a temperature threshold. According to an embodiment, if this number is smaller than an hour number threshold, the set point for the maximum state of charge is the intermediate set point, otherwise the state of charge set point is the low set point. For example, 2 hours over a 24-hour period at a temperature higher than 40° C. results in a charge with the low set point (for example, from 0% to 50%), otherwise a charge with the intermediate set point (for example, from 50% to 95%).

Further, in previously-described embodiments, the modification of the set point for the maximum state of charge from the low set point to the intermediate set point is performed by comparing ratio Esol/Eutil with the high threshold. As a variation, the modification of the set point for the maximum state of charge from the low set point to the intermediate set point may be performed when ratio Esol/Eutil becomes smaller than a first high threshold while the modification of the set point for the maximum state of charge from the intermediate set point to the low set point may be performed when ratio Esol/Eutil becomes higher than a second high threshold different from the first high threshold. Further, in previously-described embodiments, the modification of the set point for the maximum state of charge from the intermediate set point to the high set point is performed by comparing ratio Esol/Eutil with the low threshold. As a variation, the modification of the set point for the maximum state of charge from the intermediate set point to the high set point may be performed when ratio Esol/Eutil becomes lower than a first low threshold while the modification of the set point for the maximum state of charge from the high set point to the intermediate set point may be performed when ratio Esol/Eutil becomes higher than a second low threshold different from the first low threshold.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method of charging a battery of electric accumulators from the electric power supplied by an electric generator, wherein the battery is charged to a first maximum state of charge in a first operating mode and to a second maximum state of charge, lower than the first maximum state of charge, in a second operating mode, the method comprising switching from the second operating mode to the first operating mode when a criterion using the ratio of a first quantity representative of the available power capable of being supplied by the electric generator to a second quantity representative of the power consumed from the battery is fulfilled, wherein the criterion using the ratio is fulfilled when the ratio becomes lower than a first threshold.

2. The method of claim 1, comprising switching from the first operating mode to the second operating mode when the ratio of the first quantity representative of the available power capable of being supplied by the electric power generator to the second quantity representative of the power consumed from the battery becomes higher than the first threshold or than a second threshold different from the first threshold.

3. The method of claim 1, wherein the battery is charged to a third maximum state of charge lower than the second maximum state of charge in a third operating mode, the method comprising switching from the third operating mode to the second operating mode when the ratio of the first quantity to the second quantity becomes lower than a third threshold higher than the first threshold.

4. The method of claim 3, comprising switching from the second operating mode to the third operating mode when the ratio of the first quantity to the second quantity becomes higher than the third threshold, or than a fourth threshold different from the third threshold and higher than the first threshold.

5. The method of claim 3, wherein the first maximum state of charge varies from 95% to 100%, wherein the second maximum state of charge varies from 50% to 95%, and wherein the third maximum state of charge varies from 20% to 50%.

6. The method of claim 3, wherein the first threshold varies from 1 to 3 and wherein the third threshold varies from 3 to 15.

7. The method of claim 1, wherein the electric generator comprises photovoltaic cells.

8. The method of claim 7, wherein the first quantity is determined based on the measurement of the general irradiance received by the photovoltaic cells.

9. The method of claim 1, comprising determining first values over a time window, the determination of the first quantity comprising determining the average of the first values over the time window, the method further comprising determining second values, the determination of the second quantity comprising determining the average of the second values over the time window.

10. The method of claim 9, wherein the duration of the time window in the first operating mode is different from the duration of the time window in the second operating mode.

11. The method of claim 9, wherein the duration of the time window is modified at the end of an operating period of the battery.

12. The method of claim 1, comprising switching from the first operating mode to the second operating mode when a temperature of the battery is higher than a first temperature value for a determined time period.

13. The method of claim 12, comprising switching from the second operating mode to the first operating mode when the temperature of the battery is lower, for a determined time period, than the first temperature value or than a second temperature value different from the first temperature value.

14. The method of claim 12, wherein the battery is charged to a third maximum state of charge lower than the second maximum state of charge in a third operating mode, the method comprising switching from the second operating mode to the third operating mode when the temperature of the battery is higher, for a determined time period, than a third temperature value higher than the first temperature value.

15. The method of claim 14, comprising switching from the third operating mode to the second operating mode when the temperature of the battery is lower, for a determined time period, than the third temperature value or than a fourth temperature value, different from the third temperature value and higher than the first temperature value.

16. The method of claim 1, further comprising determining the state of health of the battery and holding the state of charge of the battery in the first maximum state of charge when the state of health decreases below a state-of-health value.

17. The method of claim 1, wherein the charge of the battery is further forbidden as long as a temperature of the battery is higher than a fifth temperature value.

18. The method of claim 1, wherein the charge of the battery is further forbidden as long as the temperature of the battery is lower than a sixth temperature value.

19. A system comprising an electric generator, a battery, a circuit for charging the battery from the electric power supplied by the generator, and a charge circuit control unit, the control unit being capable of controlling the battery charge to a first maximum state of charge in a first operating mode and to a second maximum state of charge, lower than the first maximum state of charge, in a second operating mode, the control unit being capable of switching from the second operating mode to the first operating mode when a criterion using the ratio of a first quantity representative of the available power capable of being supplied by the electric generator to a second quantity representative of the power consumed from the battery is fulfilled, wherein the criterion using the ratio is fulfilled when the ratio becomes lower than a first threshold.

20. The system of claim 19, wherein the control unit is capable of switching from the first operating mode to the second operating mode when the ratio of the first quantity representative of the available power capable of being supplied by the electric generator to the second quantity representative of the power consumed from the battery becomes higher than the first threshold or than a second threshold different from the first threshold.

21. The system of claim 19, wherein the control unit is capable of controlling the charge of the battery to a third maximum state of charge lower than the second maximum state of charge in a third operating mode, and wherein the control unit is capable of switching from the third operating mode to the second operating mode when the ratio of the first quantity to the second quantity becomes lower than a second threshold higher than the first threshold.

22. The system of claim 21, wherein the control unit is capable of switching from the second operating mode to the third operating mode when the ratio of the first quantity to the second quantity becomes higher than the third threshold, or than a fourth threshold different from the third threshold and higher than the first threshold.

23. The system of claim 19, wherein the control unit is capable of switching from the first operating mode to the second operating mode when a temperature of the battery is higher than a first temperature value for a determined time period.

24. The system of claim 23, wherein the control unit is capable of switching from the second operating mode to the first operating mode when the temperature of the battery is lower, for a determined time period, than the first temperature value or than a second temperature value, different from the first temperature value.

25. The system of claim 23, wherein the control unit is capable of controlling the charge of the battery to a third maximum state of charge lower than the second maximum state of charge in a third operating mode, and wherein the control unit is capable of switching from the second operating mode to the third operating mode when the temperature of the battery is higher, for a determined time period, than a third temperature value higher than the first temperature value.

26. The system of claim 25, wherein the control unit is capable of switching from the third operating mode to the second operating mode when the temperature of the battery is lower, for a determined time period, than the third temperature value or than a fourth temperature value, different from the third temperature value and higher than the first temperature value.

27. The system of claim 19, wherein the electric generator comprises photovoltaic cells.

* * * * *